(12) United States Patent
Okada et al.

(10) Patent No.: US 9,910,099 B2
(45) Date of Patent: Mar. 6, 2018

(54) BATTERY MONITORING DEVICE, POWER STORAGE SYSTEM, AND CONTROL SYSTEM

(71) Applicants: Yuruki Okada, Tokyo (JP); Sho Shiraga, Tokyo (JP); Toshihiro Wada, Tokyo (JP); Shoji Yoshioka, Tokyo (JP)

(72) Inventors: Yuruki Okada, Tokyo (JP); Sho Shiraga, Tokyo (JP); Toshihiro Wada, Tokyo (JP); Shoji Yoshioka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 289 days.

(21) Appl. No.: 14/654,787

(22) PCT Filed: Jan. 30, 2013

(86) PCT No.: PCT/JP2013/052044
§ 371 (c)(1),
(2) Date: Jun. 22, 2015

(87) PCT Pub. No.: WO2014/118911
PCT Pub. Date: Aug. 7, 2014

(65) Prior Publication Data
US 2015/0331059 A1 Nov. 19, 2015
US 2016/0146896 A2 May 26, 2016

(51) Int. Cl.
*H02J 7/00* (2006.01)
*H02J 7/14* (2006.01)
(Continued)

(52) U.S. Cl.
CPC ..... *G01R 31/3675* (2013.01); *G01R 31/3606* (2013.01); *G01R 31/3655* (2013.01);
(Continued)

(58) Field of Classification Search
USPC ....... 320/150, 134, 136, 104, 107, 103, 109, 320/113, 116, 151, 101, 108, 112, 114,
(Continued)

(56) References Cited

U.S. PATENT DOCUMENTS

| | | | | |
|---|---|---|---|---|
| 5,800,942 A | * | 9/1998 | Hamada | B60K 1/04 429/120 |
| 6,232,743 B1 | * | 5/2001 | Nakanishi | B60L 11/1803 320/103 |

(Continued)

FOREIGN PATENT DOCUMENTS

| | | |
|---|---|---|
| EP | 1 816 700 A1 | 8/2007 |
| JP | 08-148190 A | 6/1996 |

(Continued)

OTHER PUBLICATIONS

International Search Report (PCT/ISA/210) dated May 7, 2013, by the Japanese Patent Office as the International Searching Authority for International Application No. PCT/JP2013/052044.
(Continued)

*Primary Examiner* — Alexis Pacheco
(74) *Attorney, Agent, or Firm* — Buchanan Ingersoll & Rooney PC

(57) ABSTRACT

A controller of a battery monitoring apparatus, said controller calculating the amount of heat generated inside a battery on the basis of information about the electric current which flows out of or flows into the battery. Furthermore, the controller calculates the amount of heat discharged from the surface of the battery, said amount being calculated on the basis of temperature information about at least one from among the surface of the battery and a substance in the vicinity of the battery. In addition, the controller calculates the temperature inside the battery on the basis of information (Continued)

about the amount of heat generated, and information about the amount of heat discharged.

8 Claims, 17 Drawing Sheets

(51) Int. Cl.
    *G01R 31/36*     (2006.01)
    *H01M 10/48*     (2006.01)
    *H01M 10/613*    (2014.01)
    *H01M 10/46*     (2006.01)

(52) U.S. Cl.
    CPC ........... *H01M 10/486* (2013.01); *H02J 7/007* (2013.01); *H01M 10/46* (2013.01); *H01M 10/613* (2015.04); *H02J 7/0021* (2013.01); *H02J 7/0047* (2013.01)

(58) Field of Classification Search
    USPC ...... 320/130; 429/120, 62, 71, 148, 123, 99, 429/177
    See application file for complete search history.

(56) References Cited

U.S. PATENT DOCUMENTS

| | | | |
|---|---|---|---|
| 6,294,897 B1 | 9/2001 | Champlin | |
| 6,455,186 B1* | 9/2002 | Moores, Jr. | B25F 5/008 320/113 |
| 6,479,185 B1* | 11/2002 | Hilderbrand | H01M 2/1077 429/148 |
| 2005/0052160 A1* | 3/2005 | Bushong | H02J 7/0042 320/150 |
| 2005/0088140 A1* | 4/2005 | Bushong | H02J 7/0045 320/107 |
| 2007/0298316 A1* | 12/2007 | Yamamoto | H01M 10/425 429/62 |
| 2008/0157721 A1* | 7/2008 | Kaneko | H02J 7/0014 320/136 |
| 2010/0019729 A1* | 1/2010 | Kaita | B60L 11/123 320/134 |
| 2011/0262784 A1 | 10/2011 | Suga | |

FOREIGN PATENT DOCUMENTS

| | | |
|---|---|---|
| JP | H11-075327 A | 3/1999 |
| JP | 2002-189066 A | 7/2002 |
| JP | 2006-017682 A | 1/2006 |
| JP | 3733602 B2 | 1/2006 |
| JP | 2008-091239 A | 4/2008 |
| JP | 2010-035280 A | 2/2010 |
| JP | 2011-233366 A | 11/2011 |
| JP | 2012-075282 A | 4/2012 |
| RU | 2439600 C2 | 1/2012 |

OTHER PUBLICATIONS

Written Opinion (PCT/ISA/237) dated May 7, 2013, by the Japanese Patent Office as the International Searching Authority for International Application No. PCT/JP2013/052044.

Office Action (Notice of Reason of Rejection) dated Jun. 2, 2015, by the Japanese Patent Office in corresponding Japanese Patent Application No. 241299, and an English Translation of the Office Action.

The extended European Search Report dated Aug. 24, 2016, by the European Patent Office in corresponding European Patent Application No. 138737121-1568. (16 pages).

Office Action dated Nov. 29, 2016, by the Russian Patent Office in corresponding Russian Patent Application No. 2015136562 and English translation of the Office Action. (18 pages).

Partial Supplementary European Search Report dated Apr. 26, 2016, by the European Patent Office in corresponding European Application No. 13873712.7. (7 pages).

Office Action dated Nov. 6, 2017, by the Canadian Patent Office in corresponding Canadian Patent Application No. 2,897,468 (3 pages).

* cited by examiner

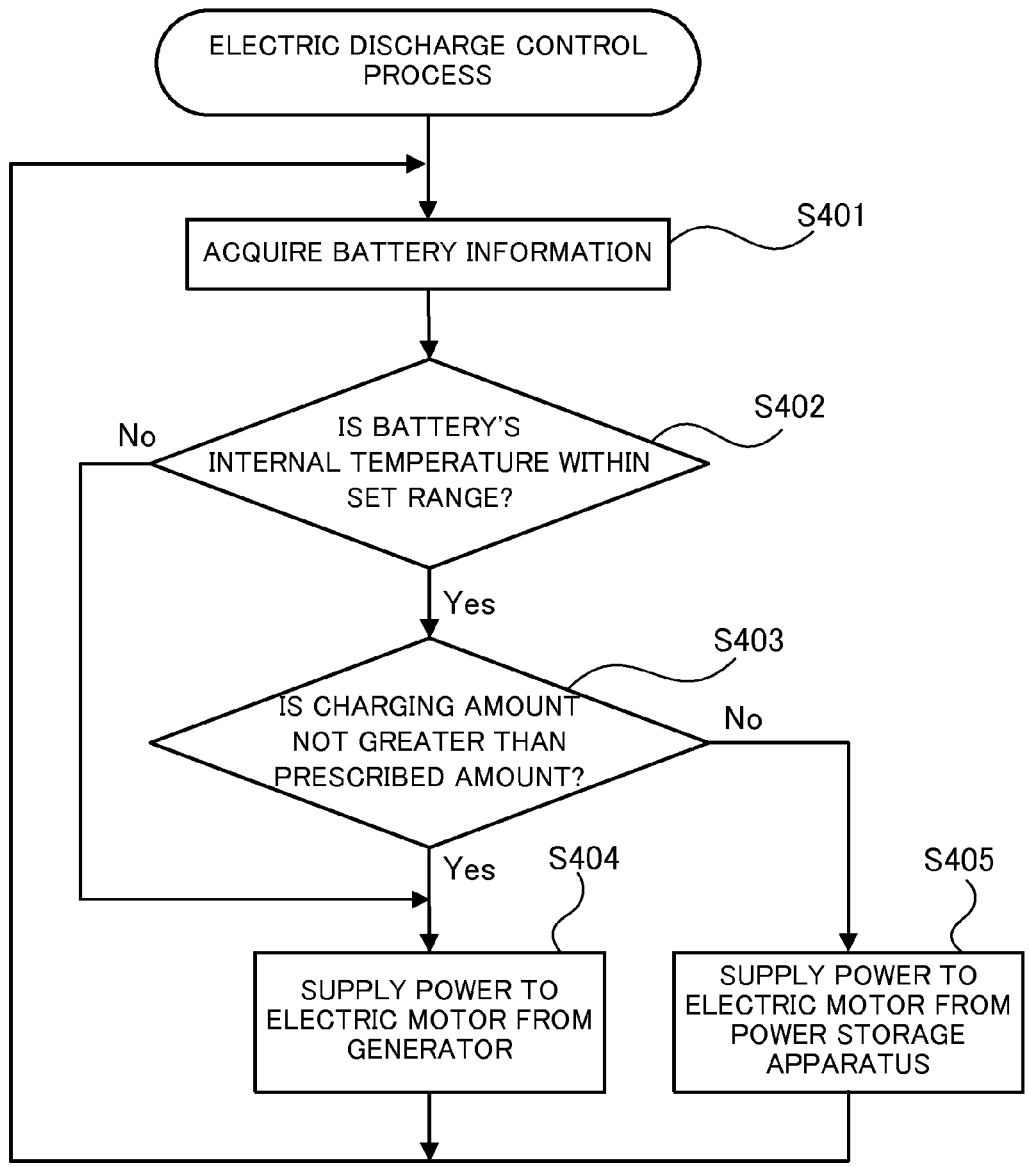

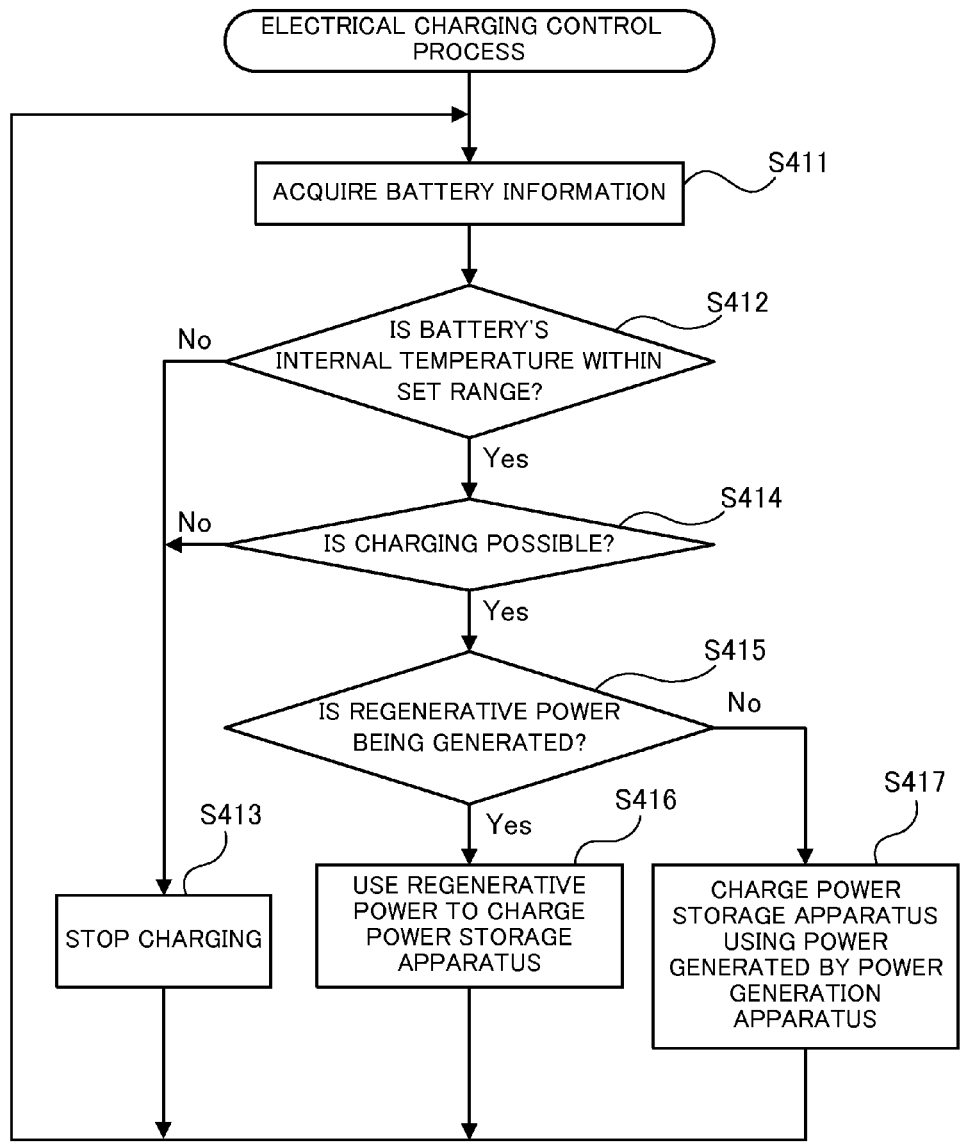

BATTERY MONITORING DEVICE, POWER STORAGE SYSTEM, AND CONTROL SYSTEM

TECHNICAL FIELD

The present disclosure relates to a battery monitoring apparatus, power storage system, and control system.

BACKGROUND ART

Batteries are readily susceptible to effects of temperature. When calculating remaining battery life, it is necessary to adequately take the effects of temperature into consideration. In Patent Literature 1, a battery device is disclosed that calculates remaining battery life of a battery using the temperature of the battery as measured by a temperature sensor.

CITATION LIST

Patent Literature

Patent Literature 1: Unexamined Japanese Patent Application Kokai Publication No. 2006-017682.

SUMMARY OF INVENTION

Technical Problem

Battery temperature necessary for calculating remaining battery life is the internal temperature of the battery. However, a battery by nature is covered with a hard shell, making it difficult to take measurements inside the battery directly with a temperature sensor. Normally, when battery temperature is necessary, the surface temperature of the battery is used. However, in reality the surface of the battery receives the influence of outside air, so the surface temperature of the battery and the internal temperature of the battery differ. When the measured surface temperature diverges from the internal temperature of the battery, the calculated remaining battery life can be quite different from the actual remaining battery life.

In consideration of the foregoing, it is an objective of the present disclosure to provide a battery monitoring apparatus, power storage system and control system with which it is possible to calculate the internal temperature of a battery with good accuracy.

Solution to Problem

The battery monitoring apparatus according to the present disclosure calculates the amount of heat generated inside a battery on the basis of information about the electric current flowing out of or flowing into the battery. In addition, the battery monitoring apparatus calculates the amount of heat discharged from the surface of the battery on the basis of temperature information about at least one out of the surface of the battery and a substance in the vicinity of the battery. The battery monitoring apparatus calculates the internal temperature of the battery on the basis of the information about the amount of heat generated and the information about the amount of heat discharged from the surface of the battery.

Advantageous Effects of Invention

With the present disclosure, it is possible to provide a battery monitoring apparatus, power storage system and control system capable of calculating the internal temperature of a battery with good accuracy.

BRIEF DESCRIPTION OF DRAWINGS

FIG. 16 is a flowchart used to explain an electrical discharging control process; and FIG. 17 is a flowchart used to explain an electrical charging control process.

DESCRIPTION OF EMBODIMENTS

Below, Embodiments of the present disclosure are described with reference to the drawings.

Embodiment 1

Figure 1:
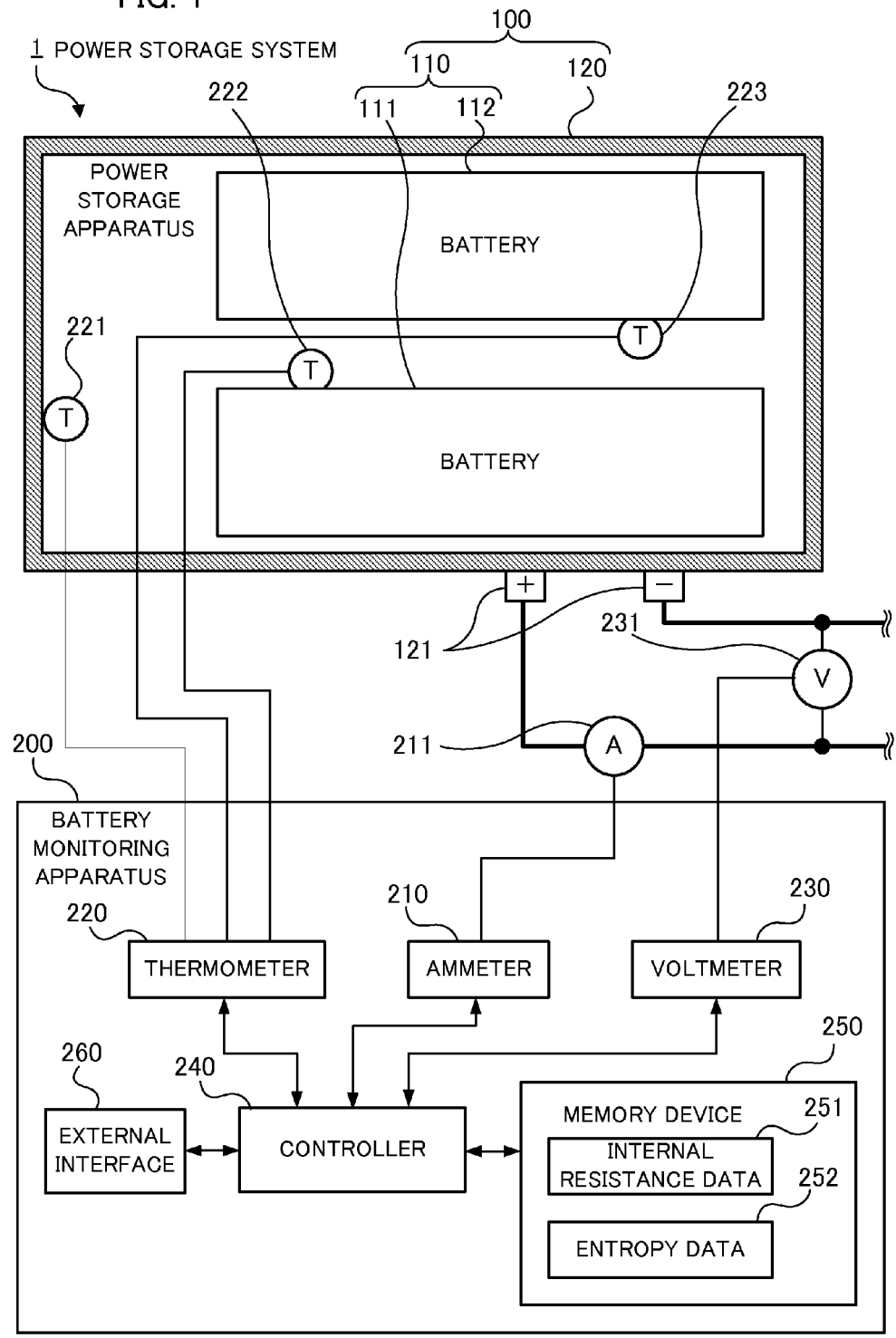
FIG. 1 is a block diagram of a power storage system according to Embodiment 1 of the present disclosure.

A power storage system 1 provided with a battery monitoring apparatus according to Embodiment of the present disclosure is, for example, a system installed in a train, automobile and/or the like for supplying energy to the train, automobile and/or the like. As shown in FIG. 1, the power storage system 1 includes a power storage apparatus 100 and a battery monitoring apparatus 200.

The power storage apparatus 100 is a power storage apparatus provided internally with multiple storage batteries. The power storage apparatus 100 includes a battery 110 and a battery housing case 120.

The battery 110 includes a battery 111 and a battery 112. The battery 111 and the battery 112 are composed of rechargeable batteries such as lead batteries, nickel-cadmium batteries, nickel-metal hydride batteries, lithium ion batteries and/or the like. The battery 111 and the battery 112 are each covered by a hard outer shell. The battery 111 and the battery 112 are connected in series and are housed within the battery housing case 120.

The battery housing case 120 is a container for housing the battery 110. The battery housing case 120 is a sealed container, and the battery 110 is in a state constantly placed in still air. Terminals 121 used in electrical charging and discharging are placed on the outer surface of the battery housing case 120. The terminals 121 are connected to the battery 111 and the battery 112, which are connected in series.

The battery monitoring apparatus 200 is an apparatus used to monitor the status of the power storage apparatus 100. The battery monitoring apparatus 200 is provided with a function for calculating and outputting an SOC (State of Charge) such as remaining battery life and/or the like. The battery monitoring apparatus 200 includes an ammeter 210, a thermometer 220, a voltmeter 230, a controller 240, a memory device 250 and an external interface 260.

The ammeter 210 includes an A-D converter and/or the like. The ammeter 210 converts an electric signal received from an electric current sensor 211 into digital data and outputs the result to the controller 240. The electric current sensor 211 is a sensor for measuring electric current flowing out from the battery 110 or flowing into the battery 110. The electric current sensor 211 is connected to the positive electrode side of the terminal 121, for example.

The thermometer 220 is a device for measuring the temperature of substances (solids, liquids and gases) in the vicinity of the battery 110 and the temperature of the surface of the battery 110. The thermometer 220 includes an A-D converter and/or the like. The thermometer 220 converts electric signals received from temperature sensors 221-223 into digital data and outputs the result to the controller 240. The temperature sensor 221 is a sensor for measuring the air temperature inside the battery housing case 120. The temperature sensor 221 is placed on the inside wall of the battery housing case 120, for example. In addition, the temperature sensor 222 and the temperature sensor 223 are sensors for measuring the surface temperature of the battery 110. The temperature sensor 222 and the temperature sensor 223 are placed on the surface of the battery 111 and the battery 112, respectively.

The voltmeter 230 includes an A-D converter and/or the like. The voltmeter 230 converts electric signals received from a voltage sensor 231 into digital data and outputs the result to the controller 240. The voltage sensor 231 is a sensor for measuring the voltage between terminals of the battery 110, and one end is connected to the positive electrode of the terminal 121 and the other end is connected to the negative electrode.

Figure 2:
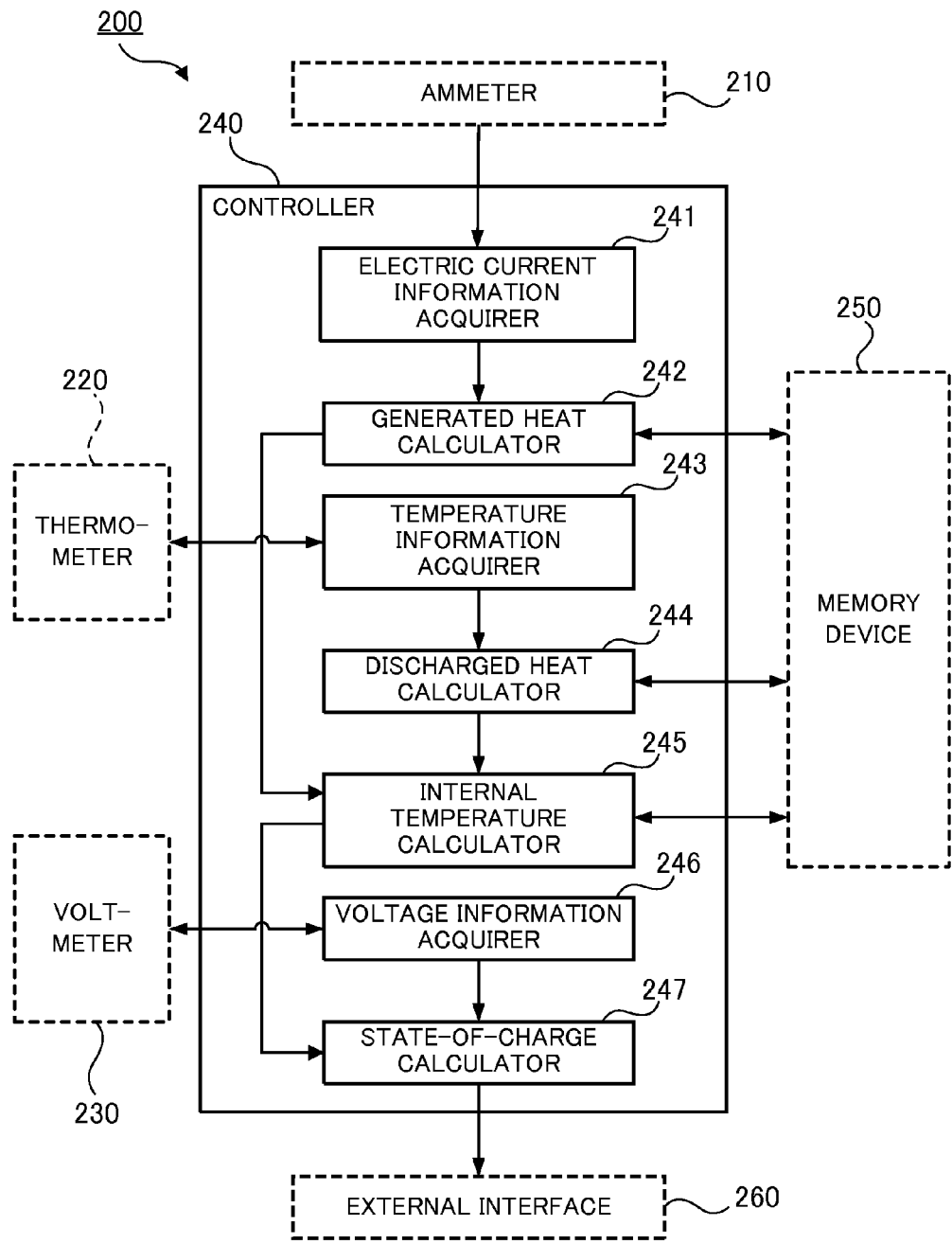
FIG. 2 is a function block diagram explaining functions possessed by a controller shown in FIG. 1.

The controller 240 includes processing devices such as a processor and/or the like. The controller 240 operates in accordance with programs stored in an unrepresented ROM (Read Only Memory) or RAM (Random Access Memory), and executes various operations including the below-described "state-of-charge calculation process." By operating in accordance with the "state-of-charge calculation process," the controller 240 functions as an electric current information acquirer 241, generated heat calculator 242, temperature information acquirer 243, discharged heat calculator 244, internal temperature calculator 245, voltage information acquirer 246 and state-of-charge calculator 247, as shown in FIG. 2. Operation of these functions is described in the explanation of the "state-of-charge calculation process" below.

Returning to FIG. 1, the memory device 250 includes a memory device such as DRAM (Dynamic Random Access Memory), SRAM (Static Random Access Memory), flash memory, a hard disk and/or the like. Various types of data such as internal resistance data 251, entropy data 252 and/or the like are stored in the memory device 250.

Figure 3A:
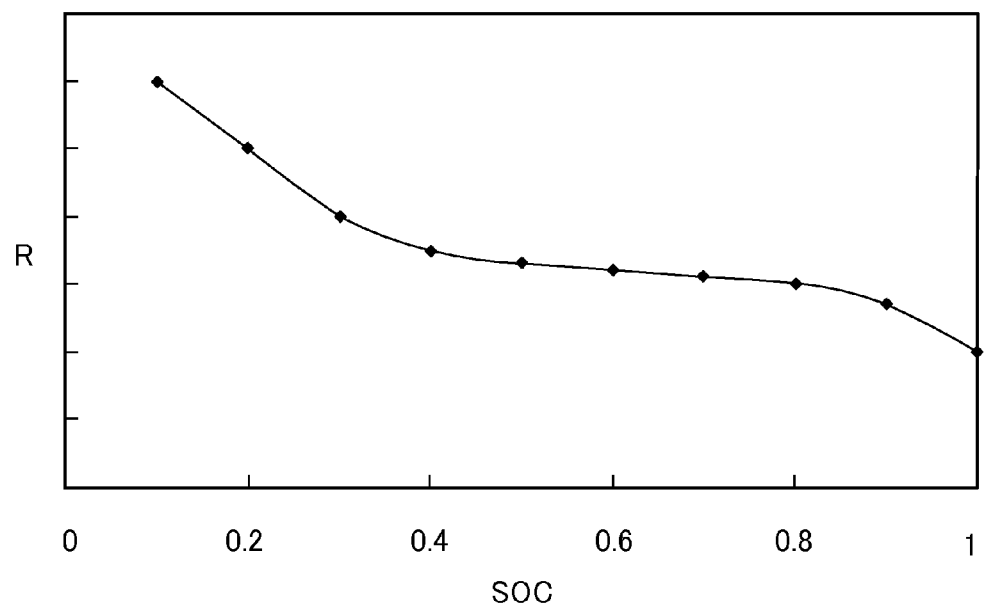
FIG. 3A is a drawing used to explain internal resistance data stored in a memory device shown in FIG. 1.

The internal resistance data 251 is data indicating the relationship between the internal resistance R and the state of charge SOC of the battery 110, for example as shown in FIG. 3A. The internal resistance data 251 may be data that was actually measured, or may be data shown in literature, and/or the like. The state of charge SOC is 1 when completely charged and 0 when completely empty.

Figure 3B:
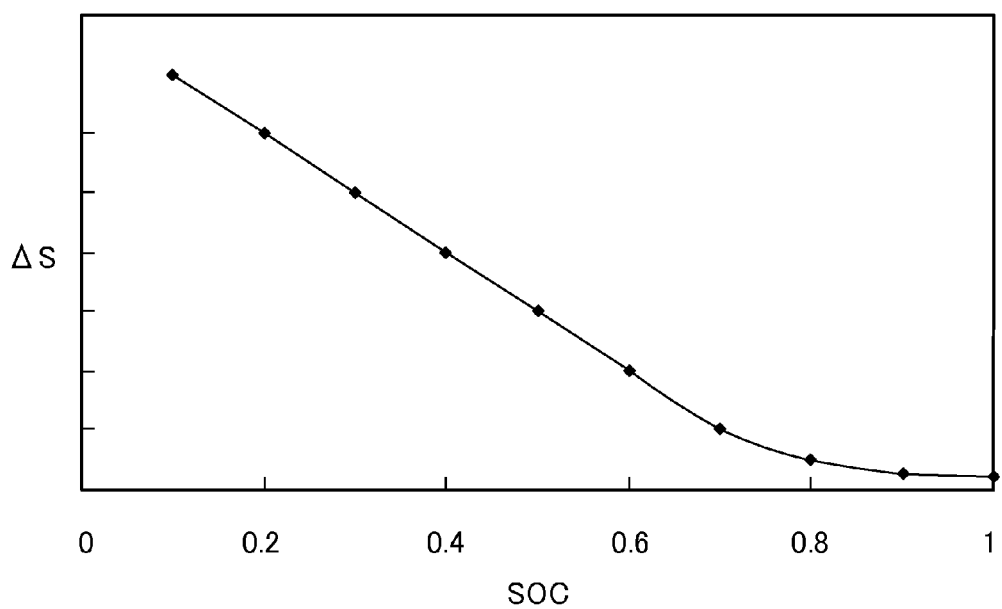
FIG. 3B is a drawing used to explain entropy data stored in the memory device shown in FIG. 1.

The entropy data 252 is data showing the relationship between the entropy ΔS and SOC of the battery 110, for example as shown in FIG. 3B. The entropy data 252 may be data that was actually measured, or may be data shown in literature, and/or the like.

The external interface 260 includes an external equipment connection interface such as a USB (Universal Serial Bus) device and/or the like. The external interface 260 sends information such as the state of charge and/or the like calculated by the controller 240 to external equipment.

Next, the operation of the battery monitoring apparatus 200 having this kind of configuration is explained.

When the battery monitoring apparatus 200 is powered on, the controller 240 starts a state-of-charge calculation process that calculates the state of charge of the power storage apparatus 100. The state-of-charge calculation process is executed at fixed time intervals. Below, the state-of-charge calculation process is explained with reference to the flowchart in FIG. 4. To facilitate understanding, in the explanation below the time interval at which the state-of-charge calculation process is executed is taken to be one second.

Figure 5:
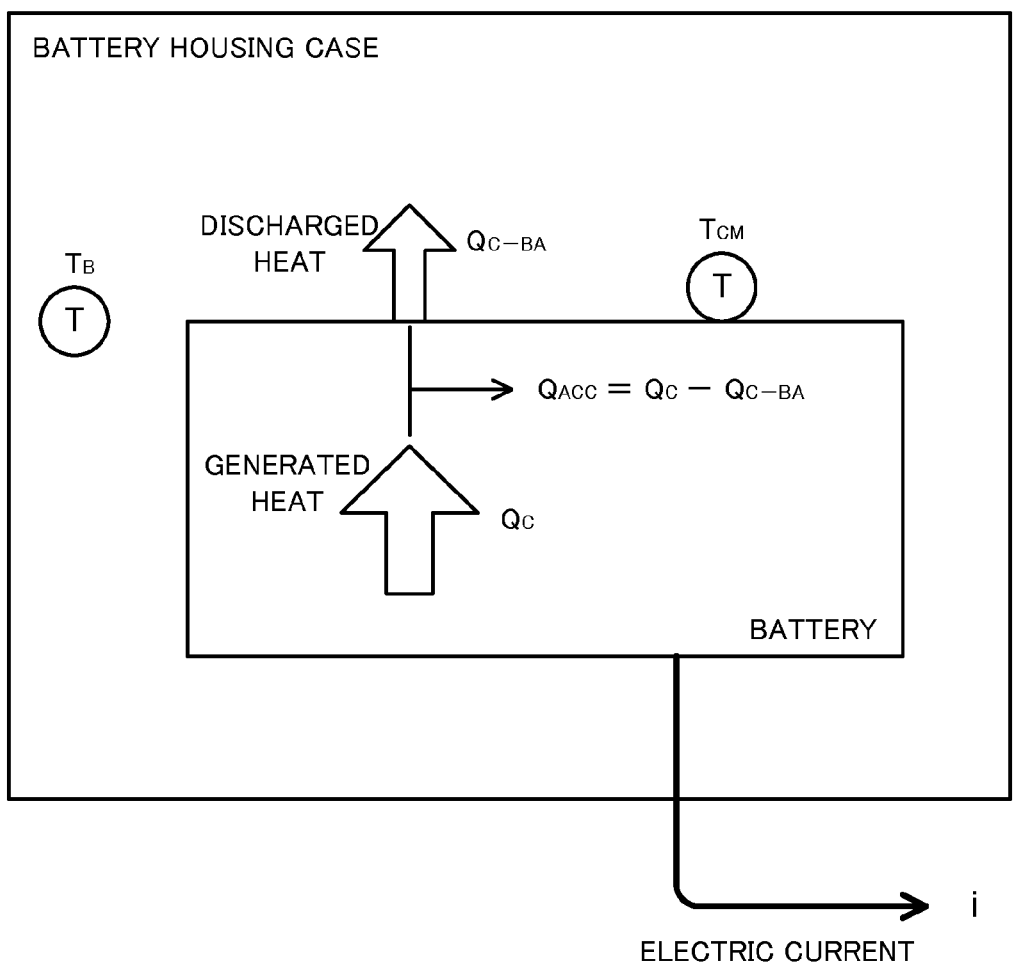
FIG. 5 is a drawing used to explain the amount of heat accumulated inside a battery.

As shown in FIG. 5, the accumulated amount of heat $Q_{ACC}$ accumulated inside the battery in one second can be calculated using the amount of heat $Q_C$ generated inside the battery in one second and the amount of heat $Q_{C-BA}$ discharged from the surface of the battery 110 in one second. If the accumulated amount of heat $Q_{ACC}$ can be calculated, it is possible to also calculate the amount of temperature change $\Delta T_C$ inside the battery in one second. By summing the amounts of temperature change $\Delta T_C$ calculated every second, it is possible to calculate an accurate internal temperature $T_{CE}$ of the battery.

Figure 6:
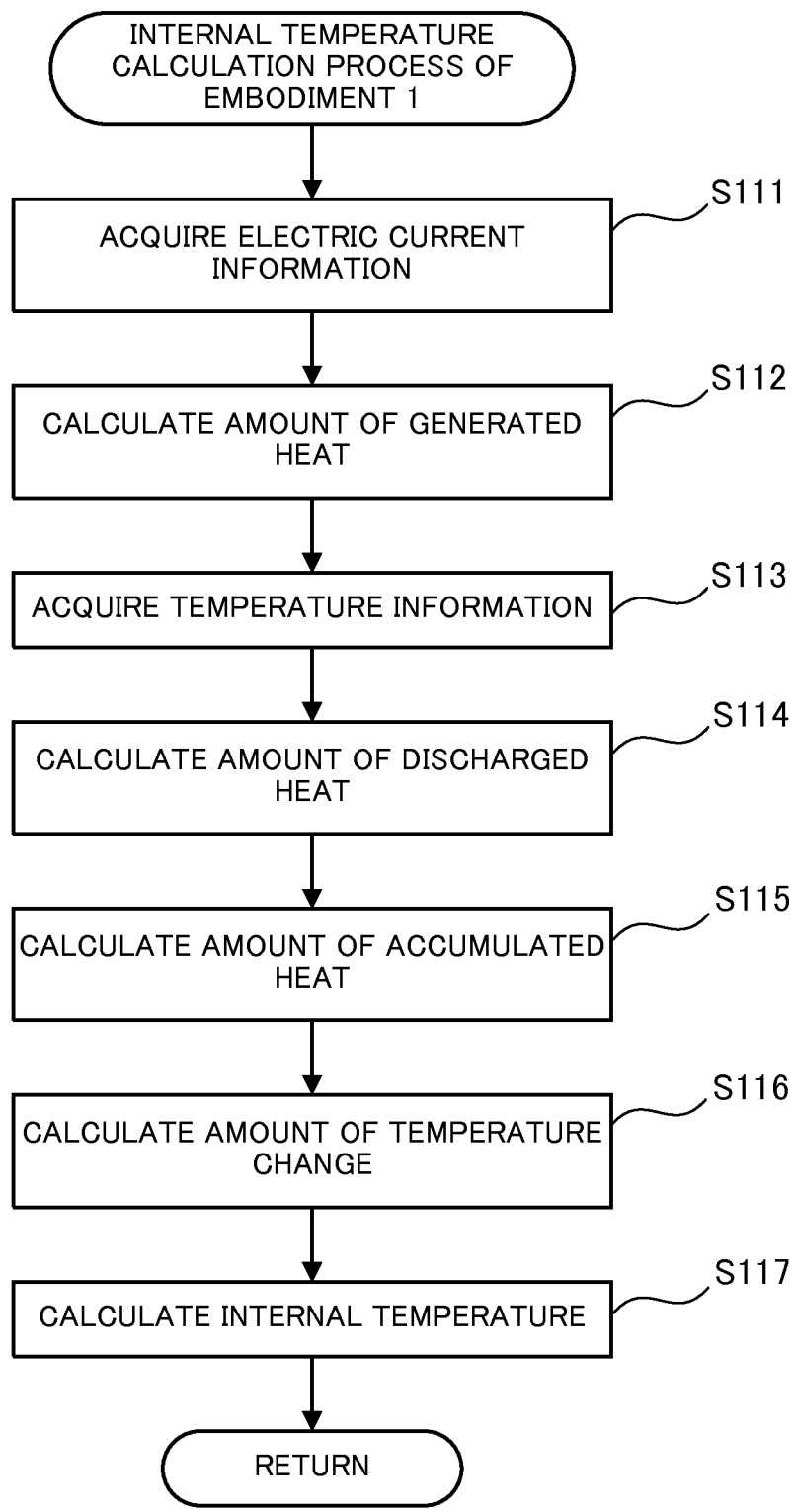
FIG. 6 is a flowchart used to explain an internal temperature calculation process according to Embodiment 1.

The controller 240 executes an internal temperature calculation process that calculates the internal temperature $T_{CE}$ of the battery by summing the amounts of temperature change $\Delta T_C$ (step S110). Below, the internal temperature calculation process is explained with reference to the flowchart in FIG. 6.

The electric current information acquirer 241 of the controller 240 acquires electric current information i measured by the electric current sensor 211 from the ammeter 210 (step S111).

The generated heat calculator 242 of the controller 240 calculates the amount of generated heat $Q_C$ using the electric current information i (step S112). The amount of generated heat $Q_C$ can be calculated using the amount of chemical reaction heat $Q_R$ from the battery reaction and the Joule heat generation $Q_J$ from the electric current, as shown in Formula 1 below. The Joule heat generation $Q_J$ and the amount of chemical reaction heat $Q_R$ can be theoretically calculated using the measured current value i, as shown in Formula 2 and Formula 3 below.

$$Q_C = Q_J + Q_R \quad \text{(Formula 1)}$$

$$Q_J = i^2 \times R \quad \text{(Formula 2)}$$

$$Q_R = T_{CE} \times \Delta S \times (i/nF) \quad \text{(Formula 3)}$$

In the above formulae, R is the internal resistance of the battery 110, $T_{CE}$ is the internal temperature of the battery 110, $\Delta S$ is the entropy, n is the number of mobile electrons and F is the Faraday constant. The value of the internal temperature $T_{CE}$ uses the value of the internal temperature $T_{CE}$ calculated by the internal temperature calculation process executed one second before. When the internal temperature calculation process is first executed after power-up, it would be fine for the internal temperature $T_{CE}$ to be replaced by a measured value from the temperature sensor 222 or the temperature sensor 223. In addition, the internal resistance R and the entropy $\Delta S$ are calculated using the internal resistance data 251 and the entropy data 252. Because the internal resistance R changes with temperature, a more accurate internal resistance R can be found by making revisions using the internal temperature $T_{CE}$. The method of calculating the amount of generated heat $Q_C$ is not limited to the above, and it is possible to use various commonly known methods.

Next, the temperature information acquirer 243 of the controller 240 acquires temperature information (air temperature $T_B$ and surface temperature $T_{CM}$) measured by the temperature sensors 221-223 from the thermometer 220 (step S113). Here, the air temperature $T_B$ is the temperature of the air inside the battery housing case 120. In addition, the surface temperature $T_{CM}$ is the temperature of the surface of the battery 110. The surface temperature $T_{CM}$ may be an average of the measured value from the temperature sensor 222 and the measured value from the temperature sensor 223, or may be either the measured value from the temperature sensor 222 or the measured value from the temperature sensor 223.

The discharged heat calculator 244 of the controller 240 calculates the amount of discharged heat $Q_{C-BA}$ discharged from the surface of the battery 110 in one second, using information about the air temperature $T_B$ and the surface temperature $T_{CM}$ (step S114). The amount of discharged heat $Q_{C-BA}$ can be calculated for example using Formula 4 below. In the below formula, h1 is a coefficient of heat transfer and A1 is the discharged heat area. The coefficient of heat transfer h1 may be a value measured in advance through experimentation. In addition, the discharged heat area A1 may be the surface area of the battery 110.

$$Q_{C-BA} = h1 \times A1 \times (T_{CM} - T_B) \quad \text{(Formula 4)}$$

The internal temperature calculator 245 of the controller 240 calculates the amount of accumulated heat $Q_{ACC}$ stored inside the battery 110 in one second, using information about the amount of generated heat $Q_C$ and the amount of discharged heat $Q_{C-BA}$ (step S115). The amount of accumulated heat $Q_{ACC}$ can be calculated for example using Formula 5 below.

$$Q_{ACC} = Q_C - Q_{C-BA} \quad \text{(Formula 5)}$$

The internal temperature calculator 245 calculates the temperature change $\Delta T_C$ of the battery 110 in one second using the amount of accumulated heat $Q_{ACC}$ (step S116). The temperature change $\Delta T_C$ can be calculated for example using Formula 6 below. In the below formula, in is the mass of the battery 110 and $C_{CLL}$ is the specific heat of the battery 110.

$$\Delta T_C = Q_{ACC}/(m \times C_{CLL}) \quad \text{(Formula 6)}$$

The internal temperature calculator 245 calculates the present internal temperature $T_{CE}$ of the battery 110 using the temperature change $\Delta T_C$ (step S117). The internal temperature $T_{CE}$ can be calculated for example using Formula 7 below. In the below formula, $T_{CE}$ on the right side is the internal temperature calculated using the internal temperature calculation process executed one second prior. When the internal temperature calculation process is executed for the first time after power-up, the value of $T_{CE}$ on the right side may be substituted with measured values from the temperature sensor 222 and the temperature sensor 223.

$$T_{CE} = T_{CE} + \Delta T_C \quad \text{(Formula 7)}$$

Figure 4:
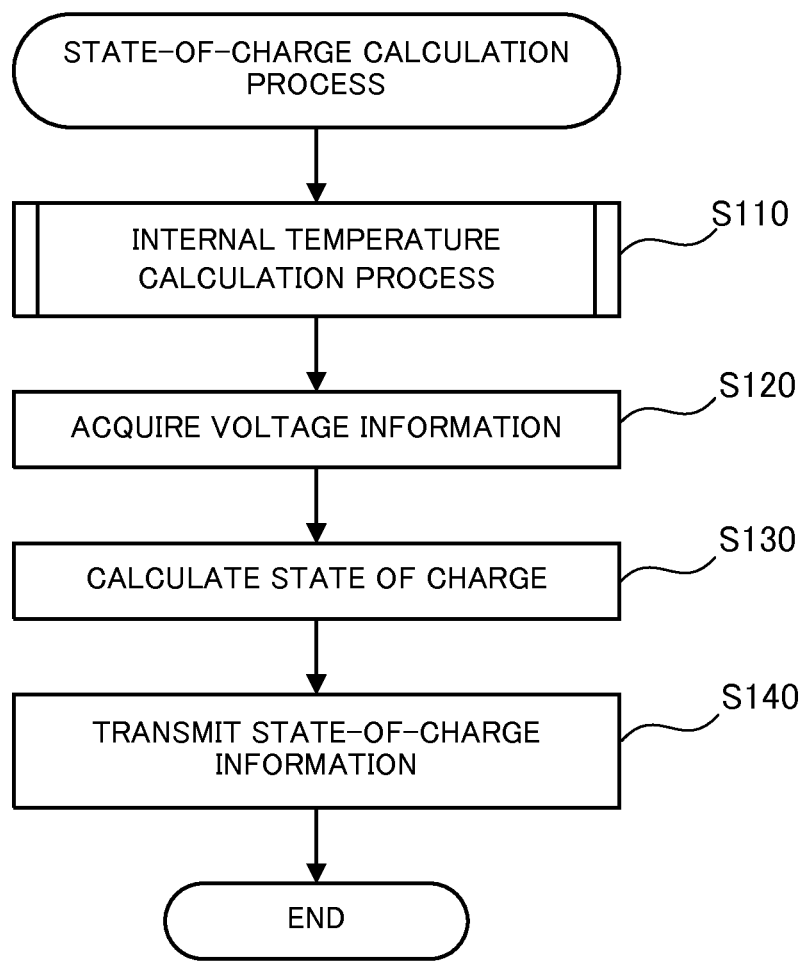
FIG. 4 is a flowchart used to explain a state-of-charge calculation process.

Returning to the state-of-charge calculation process of FIG. 4, the voltage information acquirer 246 of the controller 240 acquires the voltage information V measured by the voltage sensor 231 from the voltmeter 230 (step S120).

The state-of-charge calculator 247 of the controller 240 calculates the present state of charge SOC of the battery 110 using the voltage information V and the internal temperature $T_{CE}$ (step S130). The state of charge can be calculated for example using the method indicated below. First, the state-of-charge calculator 247 calculates the internal resistance R of the battery 110 using the internal resistance data 251 and the internal temperature $T_{CE}$. Then, the open voltage of the battery 110 is calculated by subtracting the voltage drop caused by the internal resistance R from the voltage information V. It is also possible to calculate the open voltage using the Nernst formula. Data indicating the relationship between the open-circuit voltage and the state of charge is stored in advance in the memory device 250. The state-of-charge calculator 247 calculates the present state of charge SOC of the power storage apparatus 100 using data stored in the memory device 250. The method of calculating the state of charge is not limited to this, for it is possible to use various commonly known methods.

The state-of-charge calculator 247 transmits the calculated state of charge SOC to external equipment via the external interface 260 (step S140). Once transmission is concluded, the controller 240 ends the state-of-charge calculation process. After one second has elapsed, the controller 240 again executes the state-of-charge calculation process.

With this Embodiment, the internal temperature of the battery 110 is calculated using not only temperature information but also electric current information, so it is possible to acquire highly accurate information about internal temperature.

In addition, the state of charge is calculated on the basis of the highly accurate information about internal temperature, so it is possible to acquire highly accurate information about the state of charge.

Embodiment 2

In Embodiment 1, the battery 110 was placed in still air. However, it is also possible to provide an air inlet and an air outlet in the battery housing case 120 and to thereby place the battery 110 in convective air. Below, an explanation is provided for a power storage system 1 equipped with a battery housing case 120 in which an air inlet and an air outlet are provided.

Figure 7:
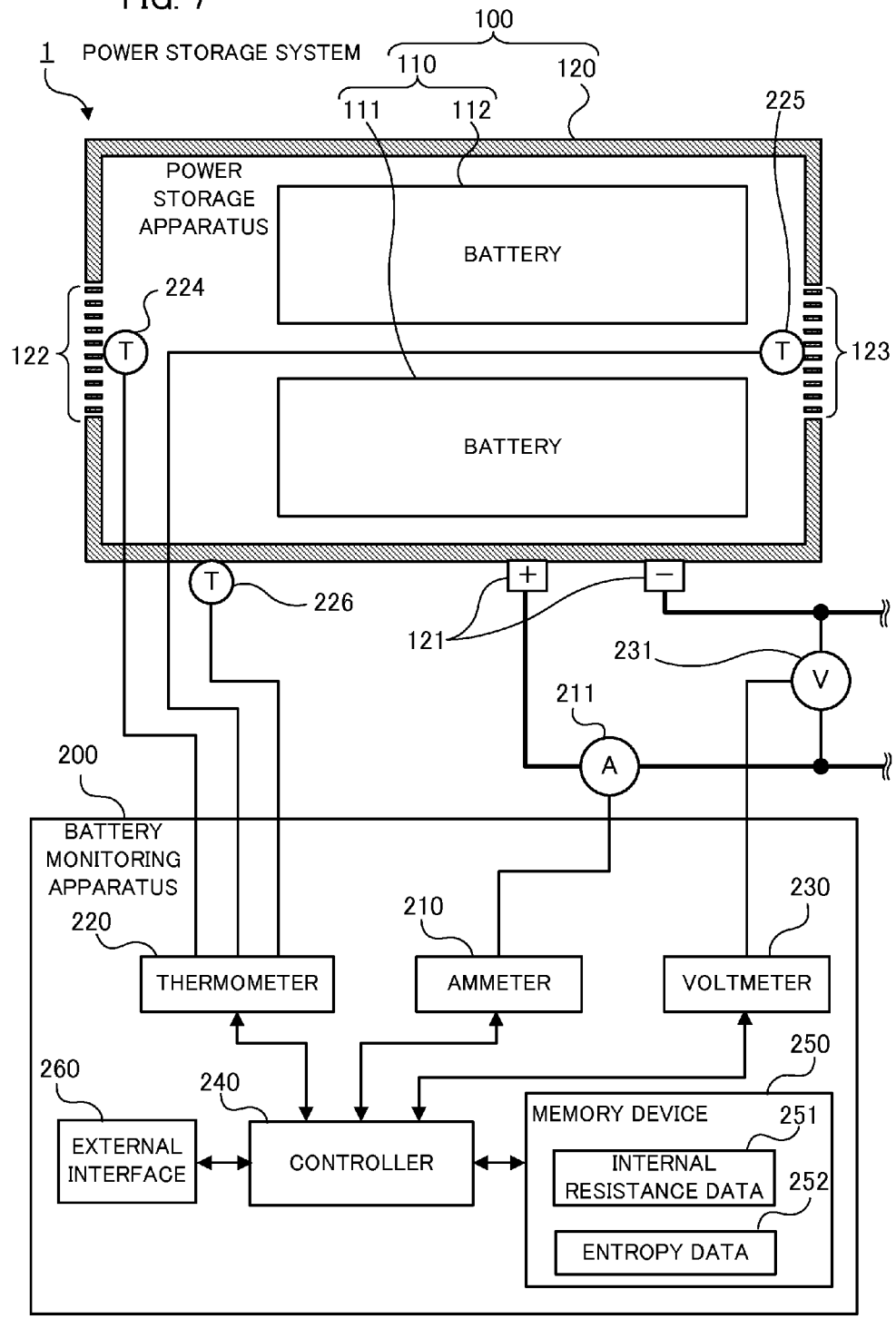
FIG. 7 is a block diagram of a power storage system according to Embodiment 2 of the present disclosure.

As shown in FIG. 7, the power storage system 1 includes a power storage apparatus 100 and a battery monitoring apparatus 200. The battery housing case 120 is a container in which an air inlet 122 and an air outlet 123 are provided. A temperature sensor 224 is a sensor for measuring the temperature of air drawn into the battery housing case 120, and is placed at the air inlet 122. A temperature sensor 225 is a sensor for measuring the temperature of air flowed out from the battery housing case 120, and is placed at the air outlet 123. A temperature sensor 226 is a sensor for measuring the temperature of the outside surface of the battery housing case 120, and is placed on the outside surface of the battery housing case 120. The thermometer 220 converts electrical signals received from the temperature sensors 224-226 into digital data and outputs the result to the controller 240. The remainder of the composition of the power storage system 1 is the same as in Embodiment 1, so explanation is omitted here.

Next, the operation of the battery monitoring apparatus 200 is described.

Figure 8:
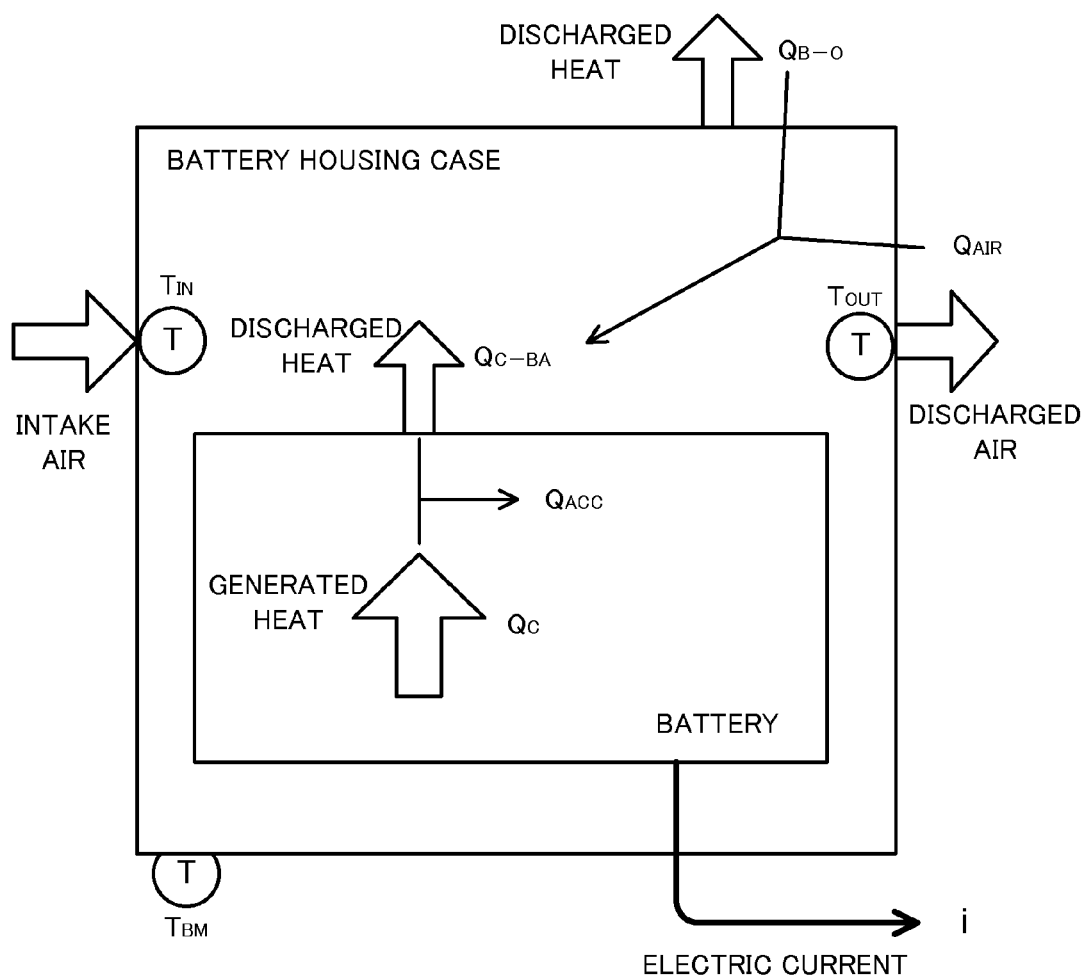
FIG. 8 is a drawing used to explain the amount of heat discharged from the surface of a battery.

Finding the coefficient of heat transfer for an object placed in still air is easy. Consequently, in Embodiment 1, the amount of discharged heat $Q_{C-BA}$ discharged from the surface of the battery 110 was calculated using the coefficient of heat transfer. However, it is not easy to find the coefficient of heat transfer for an object placed in convective air. Hence, in Embodiment 2, the amount of discharged heat $Q_{C-BA}$ is calculated using information about the amount of discharged heat $Q_{AIR}$ discharged from the air outlet 123 and the amount of discharged heat $Q_{B-O}$ discharged from the surface of the battery housing case 120, as shown in FIG. 8. If the amount of discharged heat $Q_{C-BA}$ can be calculated, it is possible to calculate the internal temperature $T_{CE}$ of the battery using the same method as in Embodiment 1.

Figure 9:
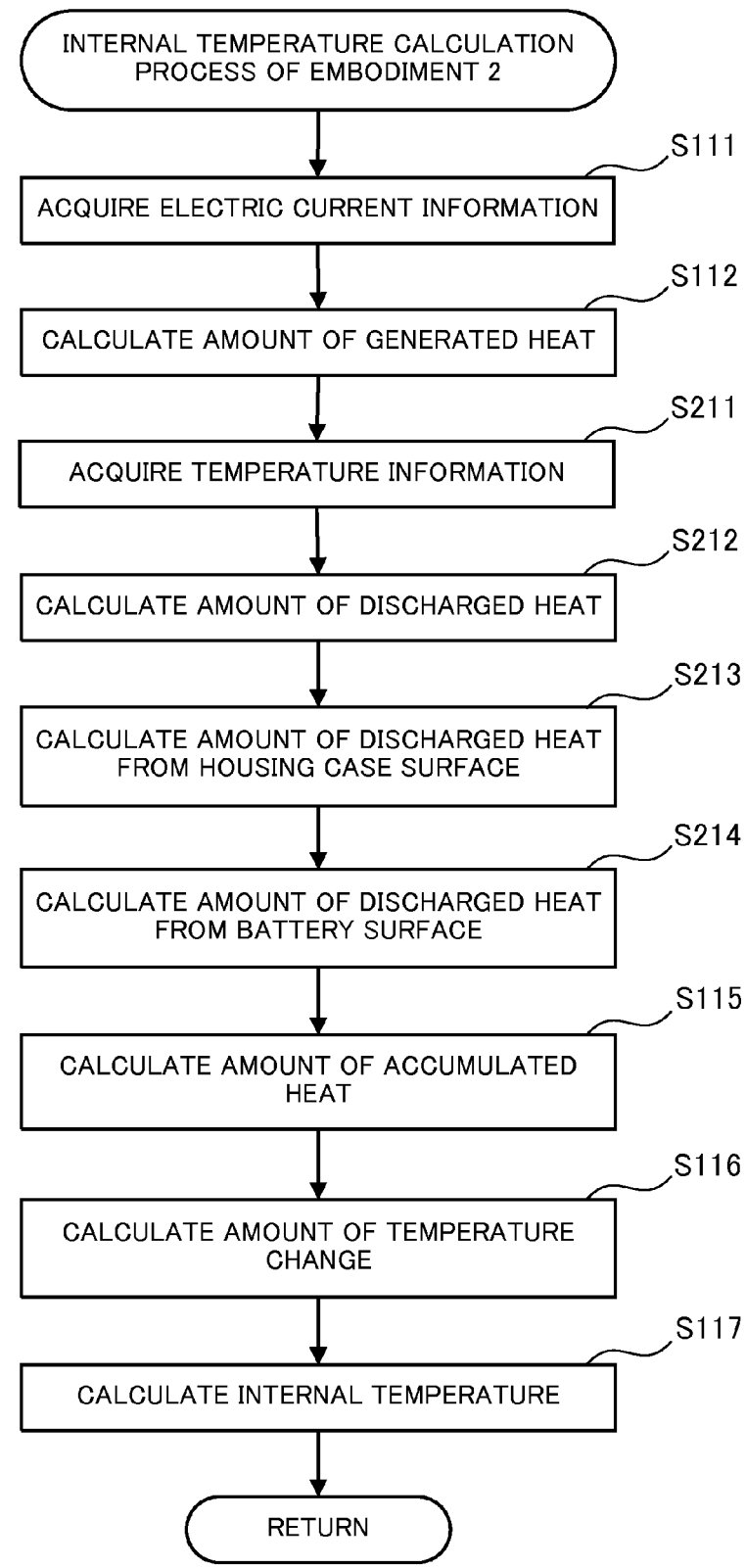
FIG. 9 is a flowchart used to explain an internal temperature calculation process according to Embodiment 2.

Below, an internal temperature calculation process for calculating the internal temperature of the battery 110 placed in the battery housing case 120 provided with the air inlet 122 and the air outlet 123 is described, with reference to the flowchart in FIG. 9. Steps other than step S211 to step S214 shown in FIG. 9 are the same as in Embodiment 1, so explanation is omitted here.

The temperature information acquirer 243 of the controller 240 acquires temperature information (outside air temperature $T_{IN}$, discharged air temperature $T_{OUT}$ and container housing surface temperature $T_{BM}$) measured by the temperature sensors 224-226 from the thermometer 220 (step S211). The outside air temperature $T_{IN}$ is the temperature of air flowing into the battery housing case 120 (that is to say, the temperature of the outside air). In addition, the discharged air temperature $T_{OUT}$ is the temperature of air flowed out from the battery housing case 120. In addition, the container housing surface temperature $T_{BM}$ is the temperature of the outside surface of the battery housing case 120.

The discharged heat calculator 244 of the controller 240 calculates the amount of discharged heat $Q_{AIR}$ discharged from the air outlet 123 in one second, using the outside air temperature $T_{IN}$ and the discharged air temperature $T_{OUT}$ (step S212). The discharged heat $Q_{AIR}$ can be calculated for example using Formula 8 below. In the below formula, $M_{AIR}$ is the amount of intake air and $C_{AIR}$ is the specific heat of the air. The amount of intake air $M_{AIR}$ may be calculated using information on the driving speed of automobiles, trains and/or the like. In addition, it would be fine to place an anemometer at the air inlet 122 or the air outlet 123 and to make calculations using values measured by the anemometer.

$$Q_{AIR}=M_{AIR} \times C_{AIR} \times (T_{OUT}-T_{IN}) \quad \text{(Formula 8)}$$

The discharged heat calculator 244 calculates the amount of discharged heat $Q_{B-O}$ discharged from the outside surface of the battery housing case 120 in one second using the housing case surface temperature $T_{BM}$ and the outside air temperature $T_{IN}$ (step S213). The amount of discharged heat $Q_{B-O}$ can be calculated for example using Formula 9 below. In the below formula, h2 is a coefficient of heat transfer and A2 is the surface area of the outside surface of the battery housing case 120.

$$Q_{B-O}=h2 \times A2 \times (T_{BM}-T_{IN}) \quad \text{(Formula 9)}$$

The discharged heat calculator 244 calculates the amount of discharged heat $Q_C$-BA discharged from the battery 110 in one second using the amount of discharged heat $Q_{AIR}$ and the amount of discharged heat $Q_{B-O}$ (step S214). The amount of discharged heat $Q_{C-BA}$ can be calculated for example using Formula 10 below.

$$Q_{C-BA}=Q_{AIR}+Q_{B-O} \quad \text{(Formula 10)}$$

With this Embodiment, it is possible to calculate the internal temperature with good accuracy even in cases in which the battery 110 is cooled by traveling wind.

Embodiment 3

In Embodiments 1 and 2, information about internal temperature was used in calculating the state of charge of the battery 110, but it is also possible to use information about internal temperature in temperature control of the battery 110. Below, a power storage system 1 that executes temperature control of the battery 110 using information about the internal temperature of the battery 110 is described.

Figure 10:
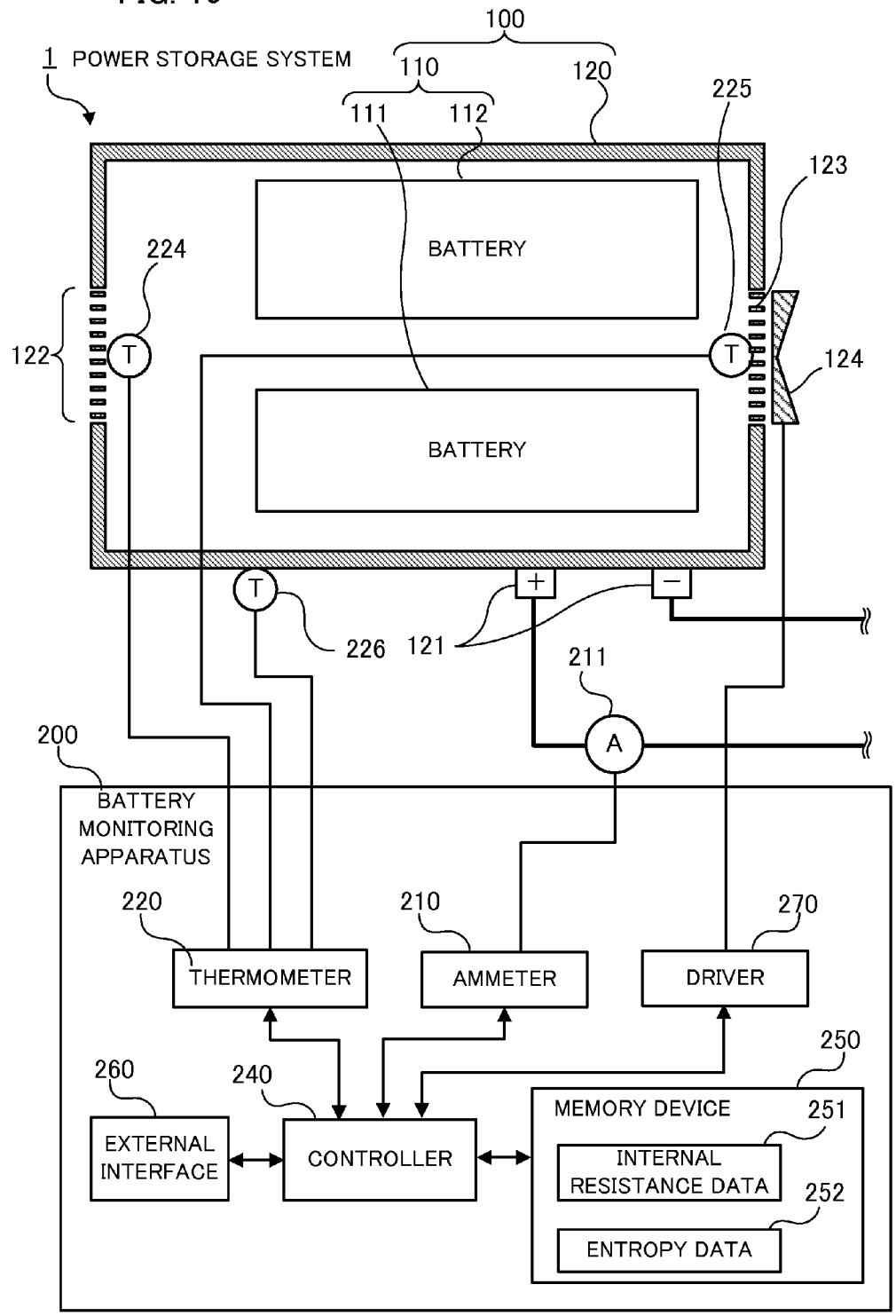
FIG. 10 is a block diagram of a power storage system according to Embodiment 3.
Figure 11:
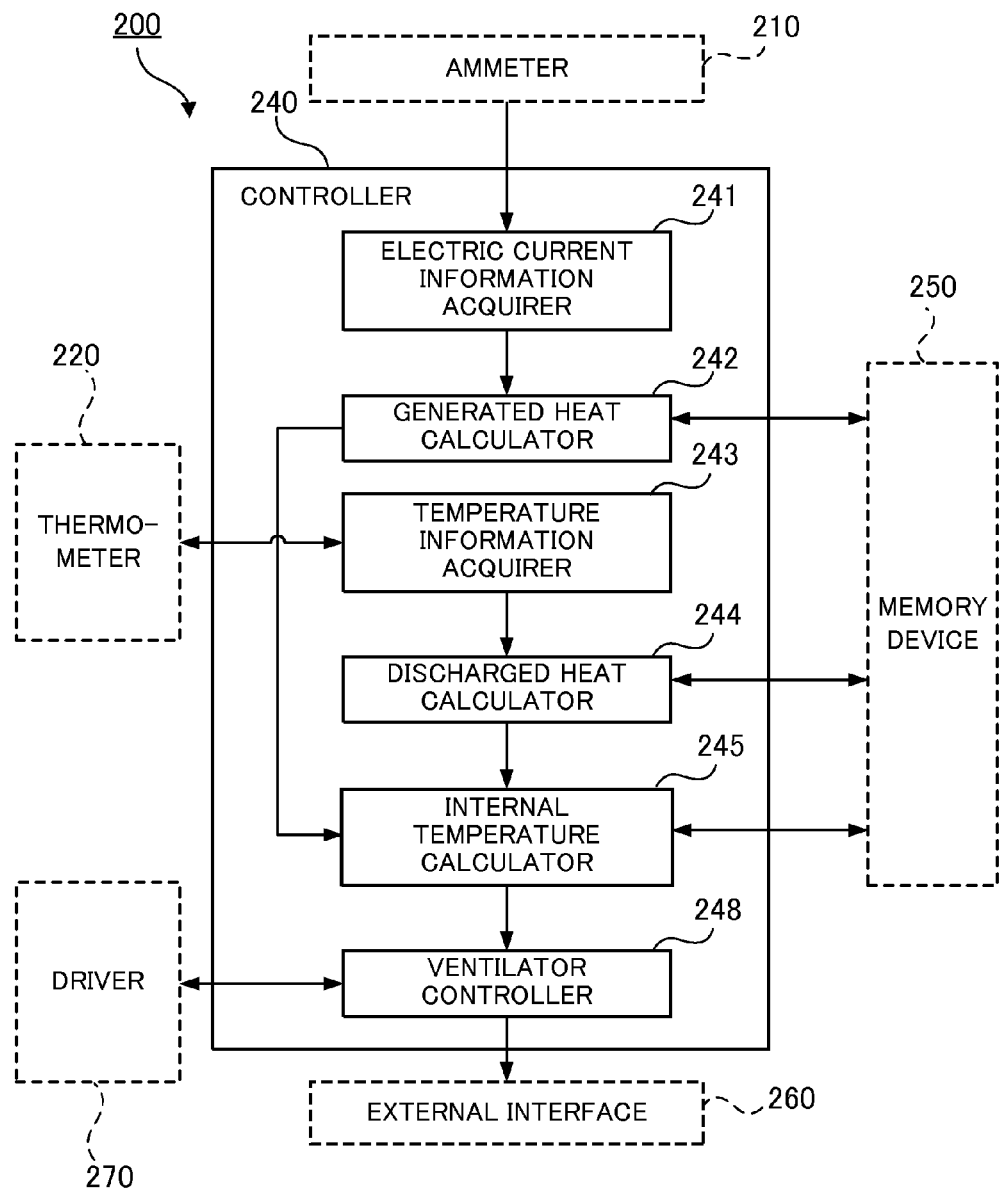
FIG. 11 is a function block diagram used to explain functions possessed by a controller shown in FIG. 10.

As shown in FIG. 10, the power storage system 1 includes a power storage apparatus 100 and a battery monitoring apparatus 200. A battery storage case 120 is a container provided with an air inlet 122 and an air outlet 123. A ventilator 124 for regulating the amount of air flowed out is placed at the air outlet 123. The battery monitoring apparatus 200 is provided with a driver 270 for causing the ventilator 124 to operate. By operating in accordance with a "battery temperature optimization process", the controller 240 of the battery monitoring apparatus 200 functions as an electric current information acquirer 241, a generated heat calculator 242, a temperature information acquirer 243, a discharged heat calculator 244, an internal temperature calculator 245 and a ventilator controller 248. The remaining composition of the power storage system 1 is the same as in Embodiment 2, so explanation is omitted here.

Next, operation of the battery monitoring apparatus 200 is described.

Figure 12:
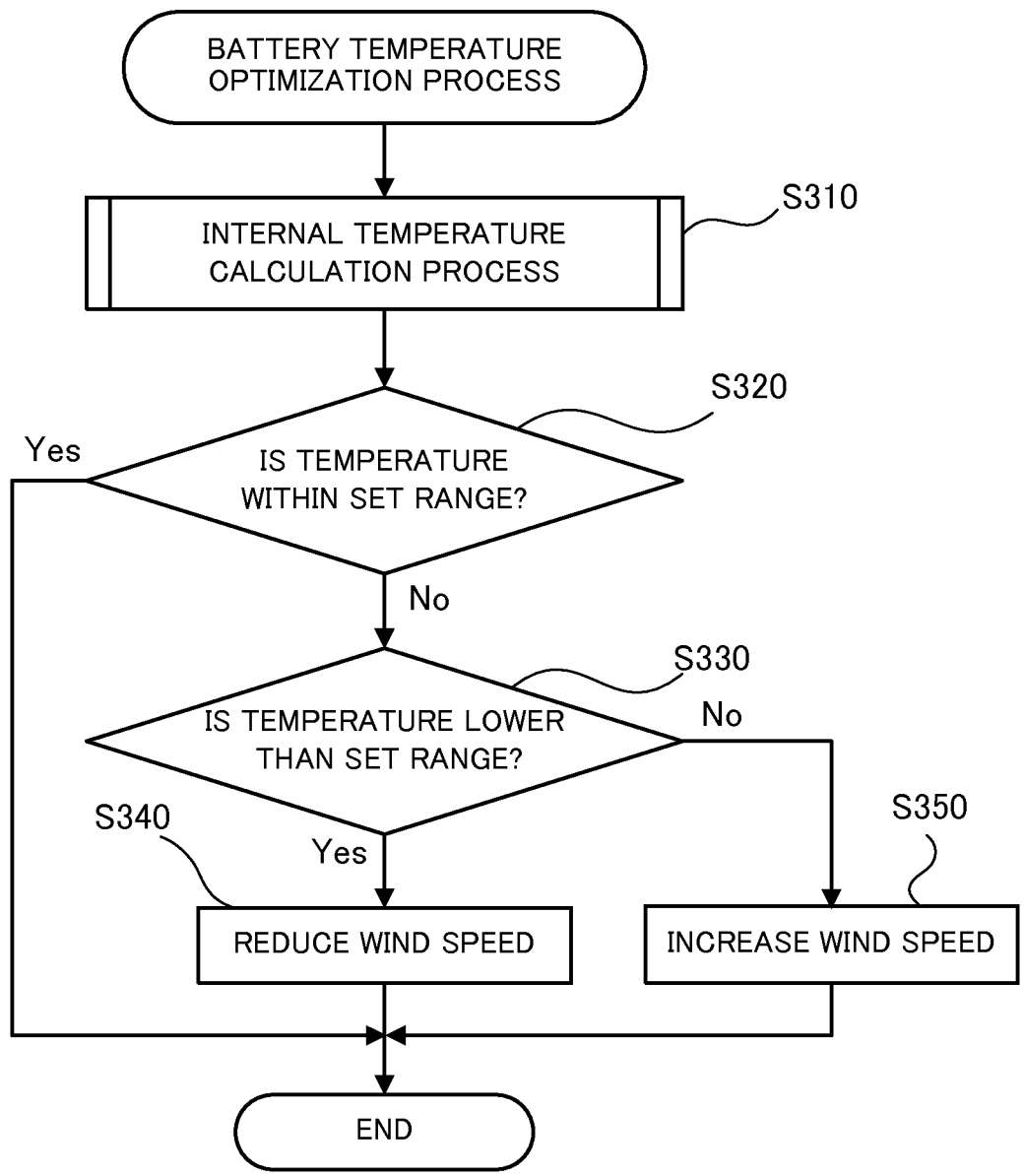
FIG. 12 is a flowchart used to explain a battery temperature optimization process.

When the battery monitoring apparatus 200 is powered on, the controller 240 executes the battery temperature optimization process at one-second intervals. Below, the battery power optimization process is described with reference to the flowchart in FIG. 12.

The controller 240 executes an internal temperature calculation process (step S310). The internal temperature calculation process is the same as the internal temperature calculation process of Embodiment 2 shown in FIG. 9, so explanation is omitted here.

The ventilator controller 248 of the controller 240 determines whether or not the internal temperature $T_{CE}$ calculated by the internal temperature calculation process of step S110 is within a range of temperatures set in advance (step S320). If the temperature is within this range (step S320: Yes), the ventilator controller 248 ends the battery temperature optimization process. If the temperature is not within this range (step S320: No), the ventilator controller 248 moves to step S330.

The ventilator controller 248 determines whether the internal temperature $T_{CE}$ is less than the set temperatures (step S330). When the internal temperature $T_{CE}$ is less than the set temperatures (step S330: Yes), the ventilator controller 248 slows the wind speed of the ventilator 124 (step S340). When the internal temperature $T_{CE}$ is greater than or equal to the set temperatures (step S330: No), the ventilator controller 248 raises the wind speed of the ventilator 124 (step S350).

When control of wind speed is completed, the controller 240 ends the battery temperature optimization process. When one second has elapsed, the controller 240 again executes the battery temperature optimization process.

With this Embodiment, it is possible to keep the temperature state of the battery 110 in an optimal state without relying on the running state.

Embodiment 4

It is also possible to use information about the state of charge and information about the internal temperature of the battery 110 in controlling charging and discharging of the battery 110. Below, a control system 2 that controls charging and discharging of the battery 110 using information about the state of charge and the internal temperature of the battery 110 is described.

Figure 14:
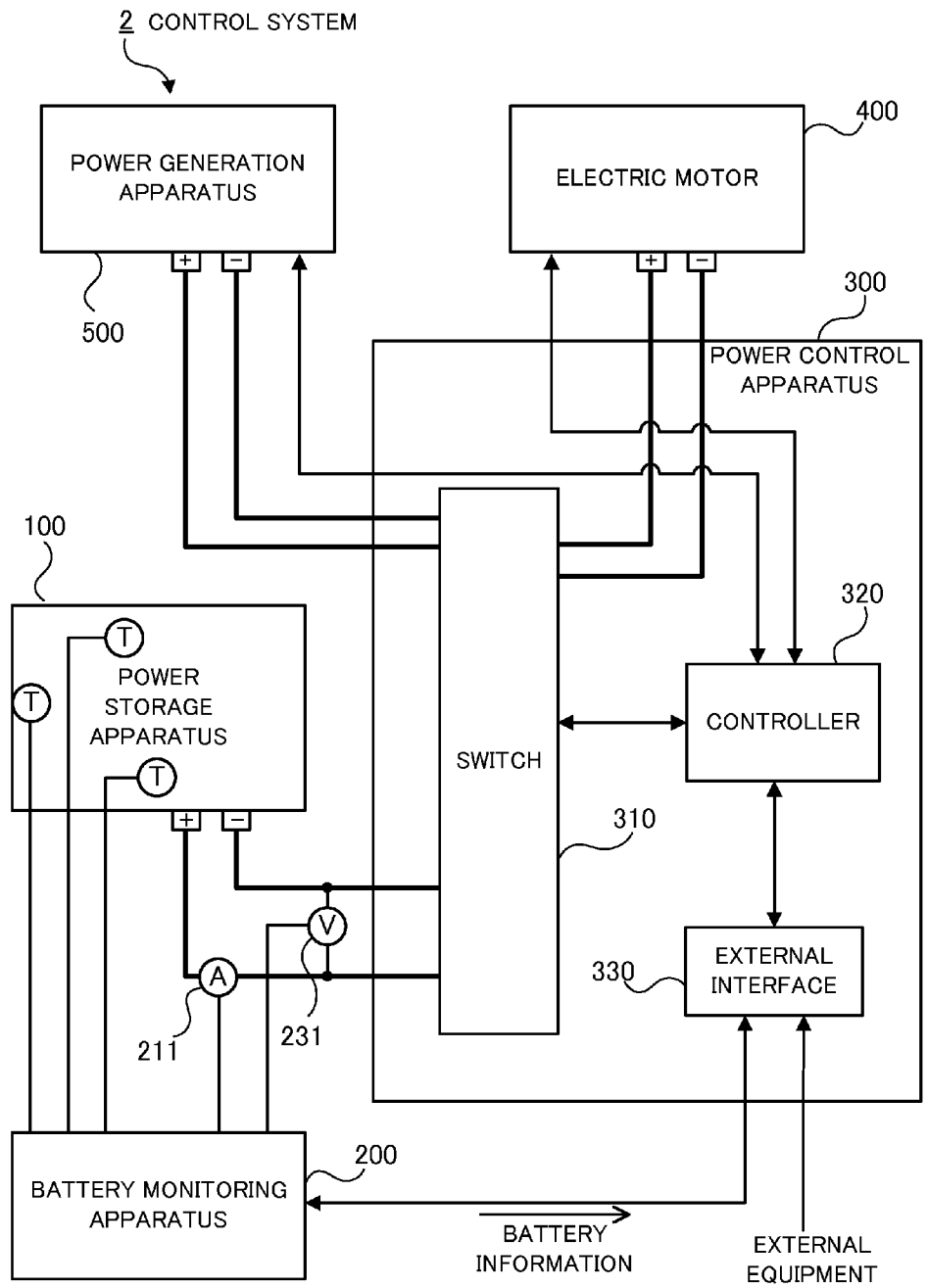
FIG. 14 is a block diagram of a control system according to Embodiment 4 of the present disclosure.

As shown in FIG. 14, the control system 2 includes a power storage apparatus 100, a battery monitoring apparatus 200, a power control apparatus 300, an electric motor 400 and a power generation apparatus 500.

The power storage apparatus 100 is a power storage apparatus provided inside with multiple storage batteries. The composition of the power storage apparatus 100 is the same as in Embodiment 1, so explanation is omitted here.

The battery monitoring apparatus 200 is an apparatus for monitoring the power storage apparatus 100. The battery monitoring apparatus 200 sends information about the battery 110 (hereafter referred to as "battery information") to the power control apparatus 300. The battery information is, for example, the internal temperature $T_{CE}$ of the battery 110 calculated by an internal temperature calculator 245, the state of charge SOC of the battery 110 calculated by a state-of-charge calculator 247, electric current information i measured by an electric current sensor 211, and voltage information V measured by the electric current sensor 211. The remaining composition of the battery monitoring apparatus 200 is the same as in Embodiment 1, so explanation is omitted here.

The power control apparatus 300 is an apparatus for controlling discharging and charging of the power storage apparatus 100. The power control apparatus 300 includes a switch 310, a controller 320 and an external interface 330.

The switch 310 is a device for switching connections among the power storage apparatus 100, the electric motor 400 and the power generation apparatus 500. When commanded from the controller 320 to connect the power storage apparatus 100 and the electric motor 400, the switch 310 connects the power storage apparatus 100 and the electric motor 400, and also disconnects the connection between the electric motor 400 and the power generation apparatus 500, and the connection between the power storage apparatus 100 and the power generation apparatus 500. In addition, when commanded from the controller 320 to connect the electric motor 400 and the power generation apparatus 500, the switch 310 connects the electric motor 400 and the power generation apparatus 500 and also disconnects the connection between the power storage apparatus 100 and the power generation apparatus 500, and the connection between the power storage apparatus 100 and the electric motor 400. In addition, when commanded from the controller 320 to connect the power storage apparatus 100 and the power generation apparatus 500, the switch 310 connects the power storage apparatus 100 and the power generation apparatus 500 and also disconnects the connection between the power storage apparatus 100 and the electric motor 400, and the connection between the electric motor 400 and the power generation apparatus 500.

The switch 310 may be provided with a DC/DC converter that changes the received electric power to a desired voltage level. In this case, the switch 310 may change the voltage level of electric power output to the power storage apparatus 100 and the electric motor 400 to a voltage level requested by the controller 320, in accordance with control by the controller 320.

Figure 15:
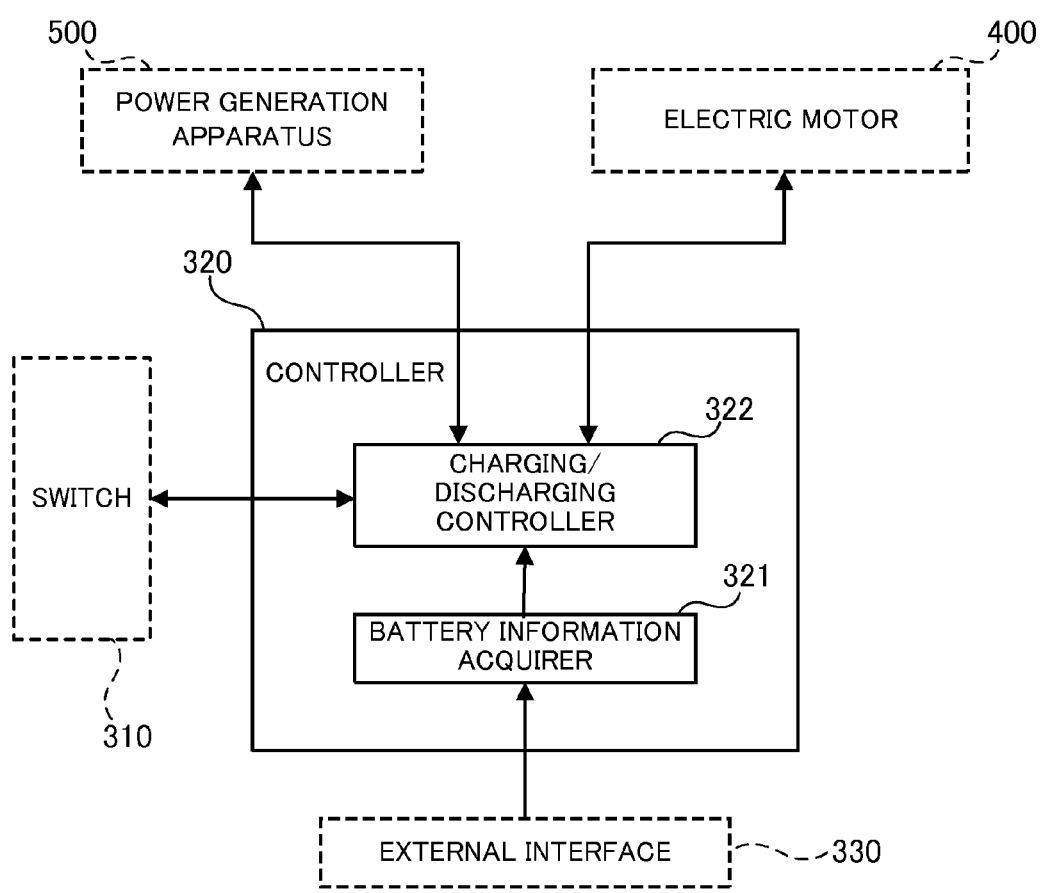
FIG. 15 is a function block diagram used to explain functions possessed by a controller shown in FIG. 14.

The controller 320 includes a processing apparatus such as a processor and/or the like. The controller 320 operates in accordance with programs stored in an unrepresented ROM or RAM, and executes various operations including the below-described "electrical discharge control process" and "electrical charging control process." By operating in accordance with the "electrical discharge control process" and "electrical charging control process," the controller 320 functions as a battery information acquirer 321 and a charging/discharging controller 322, as shown in FIG. 15. The operations of these functions are described in the below-described explanation of the "electric discharge control process" and the "electrical charging control process."

Returning to FIG. 14, the external interface 330 includes an external equipment connection interface such as a USB device and/or the like. The external interface 330 acquires battery information from the battery monitoring apparatus 200 in accordance with control by the controller 320. In addition, the external interface 330 receives start commands for electrical charging control and start commands for electrical discharge control from the external equipment.

The electric motor 400 includes an electric motor. The electric motor 400 is connected to the switch 310 of the power control apparatus 300. The electric motor 400 starts a rotation operation when electric power is supplied from the switch 310. In addition, when the supply of electric power is interrupted during the rotation operation, the electric motor 400 converts the rotational energy into electrical energy and returns this to the switch 310 as regenerative power. The electric motor 400 is connected to the controller 320 by signal lines, and whether or not regenerative power is being created is conveyed to the controller 320.

The power generation apparatus 500 includes a power generation apparatus such as a solar panel, a generator and/or the like. The power generation apparatus 500 is connected to the switch 310 of the power control apparatus 300. The power generation apparatus 500 generates electric power in accordance with control from the controller 320, and supplies the electric power to the switch 310.

Next, operation of the power control apparatus 300 is described.

The operation of the power control apparatus 300 is divided into two parts—an electrical discharge control process that controls electrical discharge of the power storage apparatus 100, and an electrical charging control process that controls charging of the power storage apparatus 100. First, the electrical discharge control process is described.

When the start of electrical discharge control is commanded from an external device, the power control apparatus 300 starts the electrical discharge control process. Below, the electrical discharge control process is described with reference to the flowchart in FIG. 16.

The battery information acquirer 321 of the controller 320 acquires battery information from the battery monitoring apparatus 200 (step S401).

The charging/discharging controller 322 of the controller 320 determines whether or not the internal temperature $T_E$ of the battery 110 is within a temperature range set in advance (step S402). When the temperature is not within this range (step S402: No), the charging/discharging controller 322 stops electrical discharging by the power storage apparatus 100, and also controls the switch 310 and connects the power generation apparatus 500 and the electric motor 400. That is to say, the charging/discharging controller 322 supplies electric power generated by the power generation apparatus 500 to the electric motor 400 (step S404). When the temperature is within the range (step S402: Yes), the process advances to step S403.

The charging/discharging controller 322 determines whether the charge amount of the battery 110 set by the state of charge SOC is not greater than a preset charge amount, for example is not greater than 10% (step S403). When the charge amount is not greater than the preset charging amount (step S403: Yes), the charging/discharging controller 322 stops electrical discharging of the power storage apparatus 100 and also controls the switch 310 and connects the power storage apparatus 500 and the electric motor 400. That is to say, the charging/discharging controller 322 supplies the electrical power generated by the power generation apparatus 500 to the electric motor 400 (step S404). When the charge amount is greater than the preset charge amount (step S403: No), the charging/discharging controller 322 stops the power generation operation of the power storage apparatus 100 and also controls the switch 310 and connects the power storage apparatus 100 and the electric motor 400. That is to say, the charging/discharging controller 322 supplies the electric power discharged by the power storage apparatus 100 to the electric motor 400 (step S405).

The controller 320 repeats the operations of step S401 to step S405 until stopping of electrical discharge control is commanded from the external equipment.

Next, the electrical charging control process is described.

When the start of electrical charging control is commanded from the external equipment, the power control apparatus 300 starts the electrical charging control process. Below, the electrical charging control process is described with reference to the flowchart in FIG. 17.

The battery information acquirer 321 acquires battery information from the battery monitoring apparatus 200 (step S411).

The charging/discharging controller 322 of the controller 320 determines whether or not the internal temperature $T_{CE}$ of the battery 110 is within a preset temperature range (step S412). When the temperature is not within this range (step S412: No), the charging/discharging controller 322 stops electrical charging of the power storage apparatus 100 (step S413). When the temperature is within this range (step S412: Yes), the process advances to step S414.

The charging/discharging controller 322 determines whether charging of the power storage apparatus 100 is possible on the basis of the charge amount of the battery 110 specified by the state of charge SOC (step S414). For example, when the charge amount of the battery 100 is 99% or more, the charging/discharging controller 322 determines that charging is not possible. When the charge amount is less than 99%, it is determined that charging is possible. When charging is impossible (step S414: No), the charging/discharging controller 322 stops charging of the power storage apparatus (step S413). When charging is possible (step S414: Yes), the process advances to step S415.

The charging/discharging controller 322 determines whether the electric motor 400 is generating regenerative power (step S415). When the electric motor 400 is generating regenerative power (step S415: Yes), the charging/discharging controller 322 controls the switch 310 and connects the electric motor 400 to the power storage apparatus 100. That is to say, the charging/discharging controller 322 supplies the regenerative power generated by the electric motor 400 to the power storage apparatus 100 (step S416). When the electric motor 400 is not generating regenerative power (step S415: No), the charging/discharging controller 322 controls the switch 310 and connects the power generation apparatus 500 and the power storage apparatus 100. That is to say, the charging/discharging controller 322 supplies power that the power generation apparatus 500 has generated to the power storage apparatus 100 (step S417).

The controller 320 repeats the operations of step S411 to step S417 until stopping of the electrical charging control is commanded from the external equipment.

With this Embodiment, charging/discharging control is done on the basis of accurate battery information, so it is possible to more safely charge and discharge the battery 110.

The above-described Embodiments are merely examples, and various variations and applications are possible.

For example, in the above-described Embodiments, the state-of-charge calculation process, the internal temperature calculation process and the battery temperature optimization process are executed at one-second intervals, but the execution interval is not limited to one second. The execution interval may be one second or less, or may be one second or more.

In addition, in the above-described Embodiments, the power storage apparatus 100 includes two batteries, but the number of batteries the power storage apparatus 100 include is not limited to two. The number of batteries may be one, or may be three or more. In addition, connection among these is not limited to series connection, for parallel connection would also be fine.

In addition, in the above-described Embodiments, temperature sensors were placed on the surfaces of the multiple batteries, but temperature sensors need not necessarily be placed on all of the batteries. It would be fine to place a temperature sensor on one of the multiple batteries, and to mimic the measured value of that temperature sensor as the surface temperatures of all of the batteries.

In addition, with the above-described Embodiments, the battery 110 was described as a rechargeable battery that can be charged, but it would be fine for the battery 110 to be a primary battery such as a manganese dry cell, an alkaline dry cell, a nickel dry cell, a lithium primary battery, a silver oxide battery, a zinc-air battery and/or the like.

In addition, in Embodiment 2, the amount of discharged heat $Q_{C-BA}$ discharged from the surface of the battery 110 was found using information about the amount of discharged heat $Q_{AIR}$ discharged from the air outlet 123 and the amount of discharged heat $Q_{B-O}$ discharged from the surface of the battery housing case 120. However, if the battery housing case 120 is composed of a material with high thermal insulating properties and the amount of discharged heat $Q_{B-O}$ is sufficiently small in relation to the amount of discharged heat $Q_{AIR}$, it would be fine for the amount of discharged heat $Q_{AIR}$ to be used as the amount of discharged heat $Q_{C-BA}$.

Figure 13:
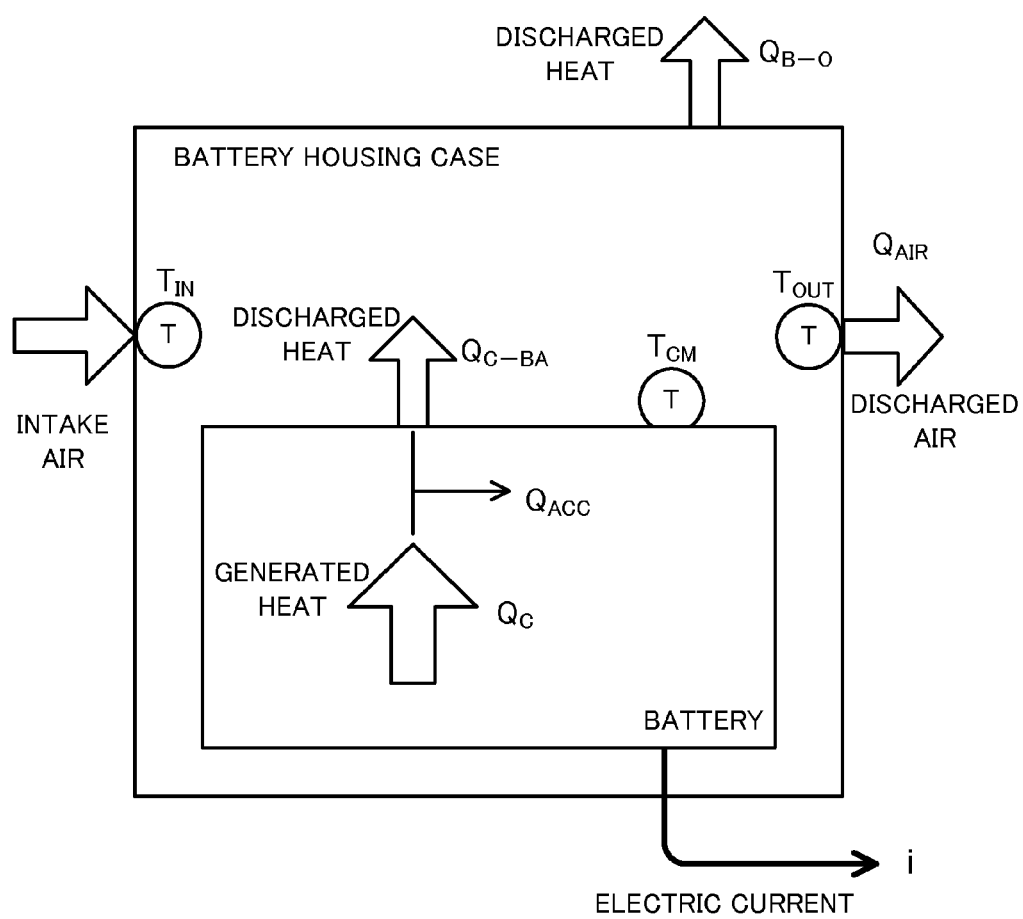
FIG. 13 is a drawing used to explain the amount of heat discharged from the surface of a battery housing case.

On the other hand, if the battery housing case 120 is made of material with a high thermal conductivity, it is also possible for the amount of discharged heat discharged from the surface of the battery 110, assuming the case of the battery 110 placed in still air, to be the amount of discharged heat $Q_{B-O}$. For example, as shown in FIG. 13, the amount of discharged heat $Q_{B-O}$ is calculated as shown below (Formula 11) with the temperature sensor placed on the surface of the battery 110, using the measured value (surface temperature MO of that sensor. In the below formula, h1 is the coefficient of heat transfer when the battery 110 is placed in still air, and A1 is the surface area of the battery 110.

$$Q_{B-O} = h1 \times A1 \times (T_{CM} - T_{IN}) \quad \text{(Formula 11)}$$

Application of the internal temperature calculated by the internal temperature calculation process is not limited to calculation of the state of charge, temperature control of the battery 110 and control of charging/discharging of the battery 110, for use is possible in a variety of commonly known applications.

In addition, the location where the power storage system 1 is placed is not limited to a train, an automobile and/or the like. The power storage system 1 may be placed for example in transportation equipment such as a bicycle, a ship, an airplane, a helicopter and/or the like, or may be placed in a building such as an office building, a substation, a power generation facility and/or the like. The power storage apparatus 100 may be a large battery installed in a train, an automobile and/or the like, or may be a portable battery used in a mobile phone and/or the like.

In addition, the control system 2 of Embodiment 4 includes both an electric motor 400 and a power generation apparatus 500, but it would be fine for the control system 2 to include only one out of the electric motor 400 and the power generation apparatus 500.

In addition, in the above-described Embodiments, the power storage apparatus 100, the battery monitoring apparatus 200 and the power control apparatus 300 were described as separate devices, but it would be fine for the battery monitoring apparatus 200 and the power control apparatus 300, for example, to be built into the power storage apparatus 100. In addition, it would be fine for the power storage apparatus 100 to be built into the battery monitoring apparatus 200 or the power control apparatus 300.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The battery monitoring apparatus, power storage system and control system of the present disclosure are suitable for systems using batteries in trains, automobiles and/or the like.

REFERENCE SIGNS LIST

1 Power storage system
2 Control system
100 Power storage apparatus
110-112 Battery
120 Battery housing case
121 Terminal
122 Air inlet
123 Air outlet
124 Ventilator
200 Battery monitoring apparatus
210 Ammeter
211 Electric current sensor
220 Thermometer
221-226 Temperature sensors
230 Voltmeter
231 Voltage sensor
240 Controller
241 Electric current information acquirer
242 Generated heat calculator
243 Temperature information acquirer
244 Discharged heat calculator
245 Internal temperature calculator
246 Voltage information acquirer
247 State-of-charge calculator
248 Ventilator controller
250 Memory device
251 Internal resistance data
252 Entropy data
260 External interface
270 Driver
300 Power control apparatus
310 Switch
320 Controller
321 Battery information acquirer
322 Charging/discharging controller
330 External interface
400 Electric motor
500 Power generation apparatus

The invention claimed is:

1. A battery monitoring apparatus, comprising:
an electric current information acquirer acquiring information about electric current flowing out of a battery or flowing into the battery;
a generated heat amount calculator calculating the amount of heat generated inside the battery, on the basis of the information about electric current acquired by the electric current information acquirer;
a temperature information acquirer acquiring temperature information about at least one out of the surface of the battery and a substance in the vicinity of the battery;
a discharged heat amount calculator calculating the amount of heat discharged from the surface of the battery, on the basis of the temperature information acquired by the temperature information acquirer; and
an internal temperature calculator calculating the internal temperature of the battery, on the basis of the generated heat amount information and the information about the amount of heat discharged from the surface of the battery,
wherein:
the battery is located inside a container having an air inlet and an air outlet,
the temperature information acquirer acquires temperature information about air supplied from the air inlet, temperature information about air flowed out from the air outlet and an external surface temperature of the container, and
the discharged heat amount calculator acquires information about the amount of air supplied from the air inlet or flowed out from the air outlet, calculates the amount of heat discharged from the container on the basis of information about the amount of air, the temperature information about air supplied from the air inlet, the temperature information about air flowed out from the air outlet and the external surface temperature of the container, and calculates the amount of heat discharged from the surface of the battery on the basis of the information about the amount of heat discharged from the container.

2. The battery monitoring apparatus according to claim 1, further comprising:
a voltage information acquirer acquiring voltage information between terminals of the battery; and
a state-of-charge calculator specifying an internal resistance value of the battery on the basis of the information about the internal temperature of the battery, calculating an open-circuit voltage value of the battery on the basis of the internal resistance value and the voltage information between terminals of the battery, and calculating the state of charge of the battery on the basis of the calculated open-circuit voltage value.

3. A power storage system provided with a power storage apparatus and a battery monitoring apparatus, wherein:
the power storage apparatus comprises at least one battery located inside a container having an air inlet and an air outlet; and
the battery monitoring apparatus comprises:
an electric current information acquirer acquiring information about electric current flowing out of a battery or flowing into the battery,
a generated heat amount calculator calculating the amount of heat generated inside the battery, on the basis of the information about electric current acquired by the electric current information acquirer,
a temperature information acquirer acquiring temperature information about air supplied from the air inlet, temperature information about air flowed out from the air outlet and an external surface temperature of the container,
a discharged heat amount calculator acquiring information about the amount of air supplied from the air inlet or flowed out from the air outlet, and calculating the amount of heat discharged from the surface of the battery, on the basis of the information about the amount of air and the temperature information about air supplied from the air inlet, the temperature information about air flowed out from the air outlet and the external surface temperature of the container acquired by the temperature information acquirer, and
an internal temperature calculator calculating the internal temperature of the battery, on the basis of the generated heat amount information and the information about the amount of heat discharged from the surface of the battery.

4. The power storage system according to claim 3, wherein:
the power storage apparatus comprises a ventilator for changing the air of the inside of the container in which the battery is located, and
the battery monitoring apparatus comprises a ventilator controller controlling the ventilator on the basis of information about the internal temperature of the battery calculated by the internal temperature calculator.

5. A control system comprising a power storage apparatus, a battery monitoring apparatus and an electric power control apparatus, wherein:
the power storage apparatus comprises at least one battery located inside a container having an air inlet and an air outlet;
the battery monitoring apparatus comprises:
an electric current information acquirer acquiring information about electric current flowing out of a battery or flowing into the battery,
a generated heat amount calculator calculating the amount of heat generated inside the battery, on the basis of the information about electric current acquired by the electric current information acquirer,
a temperature information acquirer acquiring temperature information about air supplied from the air inlet, temperature information about air flowed out from the air outlet and an external surface temperature of the container,
a discharged heat amount calculator acquiring information about the amount of air supplied from the air inlet or flowed out from the air outlet, calculating the amount of heat discharged from the surface of the battery, on the basis of the information about the amount of air and the temperature information about air supplied from the air inlet, the temperature information about air flowed out from the air outlet and the external surface temperature of the container acquired by the temperature information acquirer, and
an internal temperature calculator calculating the internal temperature of the battery, on the basis of the generated heat amount information and the information about the amount of heat discharged from the surface of the battery; and
the electric power control apparatus comprises:
a battery information acquirer acquiring from the battery monitoring apparatus at least one item of information from among information about the internal temperature of the battery and information calculated using the information about the internal temperature of the battery, and
a charging/discharging controller controlling discharging or charging of the power storage apparatus on the basis of the information acquired by the battery information acquirer.

6. The control system according to claim 5, wherein:
the battery monitoring apparatus comprises:
a voltage information acquirer acquiring voltage information between terminals of the battery, and
a state-of-charge calculator specifying an internal resistance value of the battery on the basis of the information about the internal temperature of the battery, calculating an open-circuit voltage value of the battery on the basis of the internal resistance value and the voltage information between the terminals of the battery, and calculating the state of charge of the power storage apparatus on the basis of the calculated open-circuit voltage value;
the battery information acquirer acquires information about the state of charge of the power storage apparatus from the battery monitoring apparatus; and
the charging/discharging controller controls discharging or charging of the power storage apparatus on the basis of the information about the state of charge of the power storage apparatus.

7. The control system according to claim 6, wherein:
the electric power control apparatus is connected to at least one out of a power generation apparatus and an electric motor, and is configured so as to be capable of supplying to the power storage apparatus electric power generated by at least one out of the power generation apparatus and the electric motor, and
the charging/discharging controller determines whether or not the power storage apparatus is in a state capable of charging, based on the information about the state of charge of the power storage apparatus, and when the power storage apparatus is determined to be in a state capable of charging, charges the power storage apparatus with electric power generated from the electric motor or the power generation apparatus.

8. The control system according to claim 6, wherein:
the electric power control apparatus is connected to a power generation apparatus and an electric motor, and is configured so as to be capable of supplying to the electric motor electric power generated by the power generation apparatus and electric power discharged from the power storage apparatus, and
the charging/discharging controller determines whether or not the amount of charge of the power storage apparatus is not greater than a prescribed amount, on the basis of the information about the state of charge of the power storage apparatus, and when the amount of charge is determined to be not greater than the prescribed amount, stops discharging from the power storage apparatus and supplies to the electric motor power generated by the power generation apparatus.

* * * * *